United States Patent [19]

Lee

[11] Patent Number: 5,641,987
[45] Date of Patent: Jun. 24, 1997

[54] HEAT SPREADER SUITABLE FOR USE IN SEMICONDUCTOR PACKAGES HAVING DIFFERENT PAD SIZES

[75] Inventor: Myung Jun Lee, Seoul, Rep. of Korea

[73] Assignees: Anam Industrial Co., Ltd., Seoul, Rep. of Korea; Amkor Electronics, Inc., Chandler, Ariz.

[21] Appl. No.: 479,885

[22] Filed: Jun. 7, 1995

[30] Foreign Application Priority Data

Jun. 21, 1994 [KR] Rep. of Korea ................... 94-14028

[51] Int. Cl.⁶ .................... H01L 23/495; H01L 23/28
[52] U.S. Cl. ............... 257/675; 257/667; 257/676; 257/796
[58] Field of Search ........................ 257/667, 675, 257/676, 796

[56] References Cited

U.S. PATENT DOCUMENTS

| | | |
|---|---|---|
| 4,541,005 | 9/1985 | Hunter et al. ............... 257/675 |
| 4,809,053 | 2/1989 | Kuraishi ...................... 257/675 |
| 5,225,710 | 7/1993 | Westerkamp ............... 257/675 |

FOREIGN PATENT DOCUMENTS

| | | | |
|---|---|---|---|
| 3-280453 | 12/1991 | Japan | ............... 257/675 |
| 5-145002 | 6/1993 | Japan | ............... 257/676 |
| 5-267503 | 10/1993 | Japan | ............... 257/796 |

*Primary Examiner*—Jerome Jackson
*Assistant Examiner*—T. M. Arroyo
*Attorney, Agent, or Firm*—Skjerven, Morrill, MacPherson, Franklin & Friel; Thomas S. MacDonald; Alan H. MacPherson

[57] ABSTRACT

An improved heat spreader having a specified structure suitable for commonly used in semiconductor packages regardless of pad sizes of the packages is disclosed. The heat spreader has a pad evenly provided with a plurality of first indentations. A plurality of outward broadening openings radially extend from the pad. A plurality of second indentations are provided on a leadframe facing surface of the heat spreader at the outside of the openings, so that the second indentations surround the openings. A plurality of small coupling sections radially extend on the edge of the heat spreader at every 90° angle. The small coupling sections have their downward extending projections at their distal ends. A plurality of large coupling sections diagonally extend on the edge of the heat spreader. Each of the large coupling sections has a plurality of outward extending projections.

5 Claims, 2 Drawing Sheets

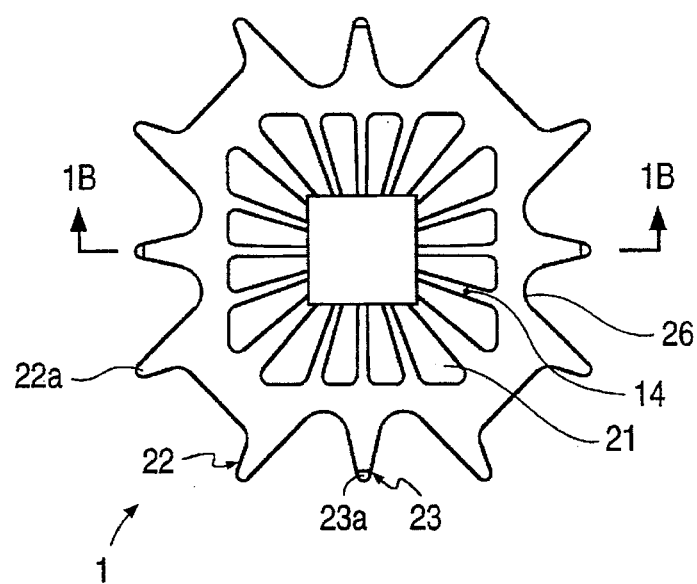
FIG. 1A
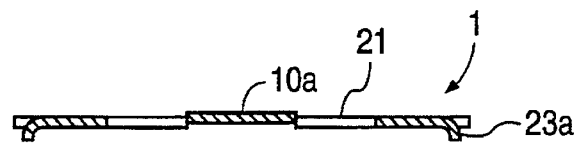
FIG. 1B
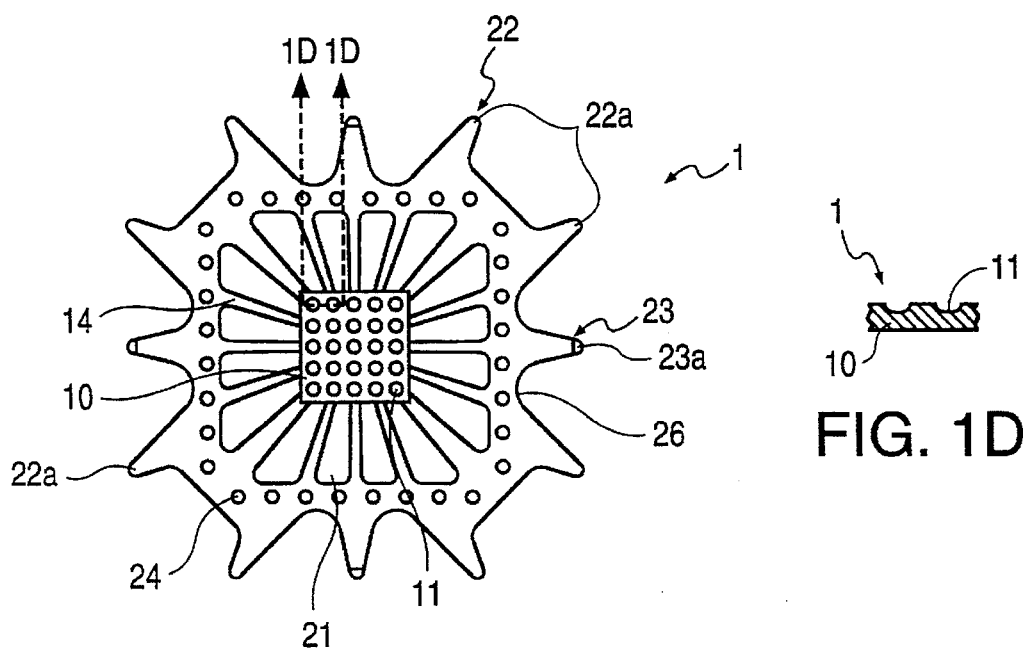
FIG. 1C
FIG. 1D

HEAT SPREADER SUITABLE FOR USE IN SEMICONDUCTOR PACKAGES HAVING DIFFERENT PAD SIZES

BACKGROUND OF THE INVENTION

1. Field of the Invention

The present invention relates in general to heat spreaders for semiconductor packages and, more particularly, to a structural improvement in such a heat spreader for commonly using the heat spreader for varieties of surface mounting packages, such as MQFP, TOFP, PLCC, TSOP and SOJ, regardless of pad sizes of the semiconductor packages.

2. Description of the Prior Art

In the early stage of semiconductor packaging development, an integrated circuit (IC) was packaged by a metal can or packaged between ceramic lid and base. Both packaging materials, or the metal can and the ceramic lid and base, provide good thermal performance for the IC packages. However, the above packaging materials have a problem that they are considerably expensive and need to be packaged through a troublesome packaging technique, which technique wastes much time. For example, in a ceramic package, it is noted that the cost caused by use of two ceramic substrates forms a considerable part of the total cost of the ceramic package.

Watched with keen interest among the developed cheaper packages are plastic packages. The plastic packages remarkably reduce the cost for production of packages, however, the plastic packages have a problem that they are lacking of good thermal performance, which performance can be effected by the typical metal or ceramic packages. As the data processing speed of the IC packages becomes faster and as the density of the IC packages is increased, the IC packages need to be improved in their thermal performance. That is, it is necessary to improve the thermal emission ability of the IC packages. In an effort to effectively emit the heat from the IC chip of the IC package to the outside without affecting the operational reliability of the package due to mechanical designing of the package and due to associated assembly process, a metal heat spreader is preferably installed in the IC package.

However, the typical metal heat spreader has a problem that it needs to be changed with another spreader in accordance with pad size of the package. This problem will become worse particularly when the pad has either a slot or a through hole.

SUMMARY OF THE INVENTION

It is, therefore, an object of the present invention to provide an improved heat spreader for a semiconductor package in which the above problems can be overcome and which has a specified structure suitable for common use in semiconductor packages regardless of pad sizes of the packages reduces thermal stress, which stress will be applied to the package during the packaging as well as after packaging, and which improves the operational reliability of the resulting package.

In order to accomplish the above object, a heat spreader in accordance with a preferred embodiment of the present invention comprises: a pad evenly provided at its center surface thereof facing a leadframe, the pad having a plurality of first indentation; a plurality of rectangular openings broadening radially outwardly of the pad; a plurality of second indentation provided on a surface of the heat spreader at the outside of the openings, so that the second indentation surround the openings; a plurality of small coupling sections radially extending on the edge of the heat spreader at every 90° angle, the small coupling sections having their downward extending projections at distal ends; and a plurality of large coupling sections diagonally extending on the edge of the heat spreader, so that the large coupling sections and the small coupling sections are alternately placed on the edge of the heat spreader, each of the large coupling sections having a plurality of outward extending projections.

In another embodiment, the heat spreader also includes four through holes which are provided between the first indentations of the pad, so that the through holes are diagonally opposed to each other on the pad, and a plurality of through holes which are provided between the second indentations at the outside of diagonally extending openings of the outward broadening openings.

BRIEF DESCRIPTION OF THE DRAWINGS

Other objects and aspects of the invention will become apparent from the following description of embodiments with reference to the accompanying drawings in which:

FIGS. 1A to 1D are views showing a heat spreader in accordance with a primary embodiment of the present invention, in which:

FIG. 1A is a plan view of the heat spreader;

FIG. 1B is a sectional view of the heat spreader taken along the section line 1B—1B of FIG. 1A;

FIG. 1C is a bottom view of the heat spreader; and

FIG. 1D is a sectional view of the heat spreader taken along the section line 1D—1D of FIG. 1C;

DESCRIPTION OF THE PREFERRED EMBODIMENTS

Figure 2:
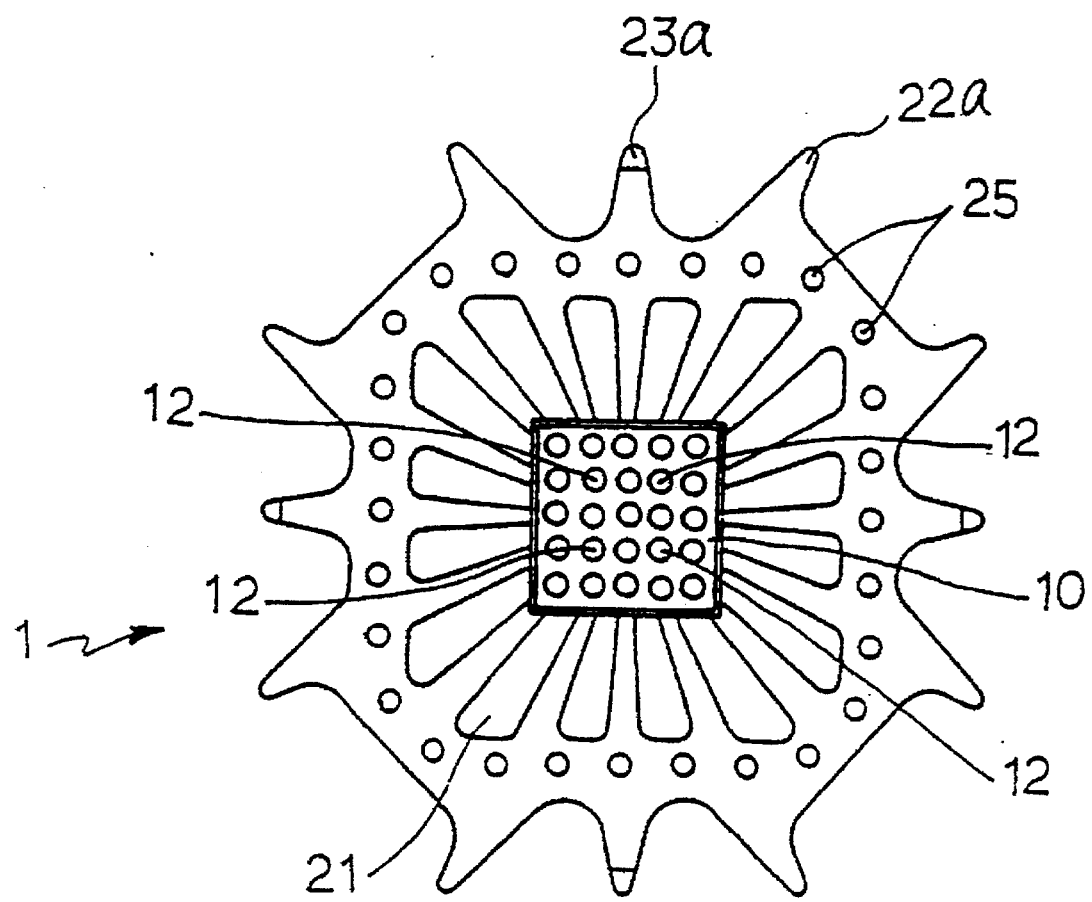
FIG. 2 is a bottom view of a heat spreader in accordance with a second embodiment of the present invention.

With reference to FIGS. 1A to 1D, there is shown a heat spreader suitable for commonly used in semiconductor packages having different pad sizes in accordance with a primary embodiment of the present invention. In the drawings, the reference numeral 1 denotes the heat spreader of the invention. A rectangular center pad 10 is placed on the center of the heat spreader 1. The center pad 10 is evenly provided with a plurality of first indentations 11. The heat spreader 1 also has asteroid-shaped legs extending from the sides of the pad 10 outward. As shown in FIG. 1(B) the pad 10 has a top position 10a which is in a plane displaced from the plane of legs 14. A plurality of outward broadening longitudinal openings 21 are radially provided on the leg at the outside of the pad 10, so that the openings 21 radially extend from the sides of the pad 10 and are spaced out at regular intervals. As shown in the drawings, each of the outward broadening openings 21 is linearly enlarged in its width in such a manner that the inside end of each opening 21 has the smallest width, but the outside end of each opening 21 has the largest width. A plurality of regularly spaced second indentations 24 are provided on a surface of the frame of the heat spreader 1 facing the associated leadframe, such that the indentations 24 surround the openings 21. The indentations 24 are spaced apart from the outside ends of the radially extending openings 21.

The leg of the heat spreader 1 also includes four small coupling sections 23 having their downward extending projections 23a at their distal ends. The small coupling sections 23 radially extend on the frame at every 90° angle, so that each of the sections 23 extends vertically or horizontally. Meanwhile, four large coupling sections 22 diagonally extend on the frame of the heat spreader 1, so that the large coupling sections 22 and the small coupling sections 23 are alternately formed on the outside edge of the frame of the heat spreader 1. Each of the large coupling sections 22 has a plurality of, for example, two, outward extending projections 22a. In the heat spreader 1, a dimple 26 is formed between each outward extending projection 22a of the large coupling sections 22 and an adjacent downward extending projections 23a of the small coupling sections 23. In the present invention, the dimples 26 of the heat spreader 1 are adapted for improving the bonding force of the heat spreader 1 with respect to the mold compound when molding the package.

With the plurality of indentations 11 evenly provided in the center pad 11 and the plurality of outward broadening openings 21 radially extending from the sides of the pad 10, the resulting semiconductor package will not cause delamination between the leadframe and the pad 10. That is, when molding the package using mold compound after die attaching, the mold compound is densely charged in the indentations 11 of the pad 10 and passes through the openings 21 so as to be rigidly bonded to the leadframe, thus to prevent possible delamination between the leadframe and the pad 10 of the resulting package. Furthermore, the molding strength of the mold compound is increased owing to both the outward extending projections 22a of the large coupling sections 22 and the downward extending projections 23a of the small coupling sections 23 of the heat spreader 1. In this regard, there will be no delamination between the heat spreader 1 and the mold compound of the resulting package.

In the heat spreader 1, the downward extending projections 23a of the small coupling sections 23 keep the balance of the heat spreader 1 in the mold cavity of the package. The projections 23a also provide the maximum space for a laser marking part as the projections 23a are placed at the outside of the laser marking part when laser-marking the package surface after packaging. In this regard, the projections 23a are not exposed to indentations formed on the package surface, which indentations are formed on the package surface as a result of etching of the laser marking step. The projections 23a thus improve the outer appearance of the package and facilitate the laser marking operation.

Turning to FIG. 2, there is shown in a bottom view a heat spreader in accordance with a second embodiment of the present invention. In the second embodiment, the general shape of the heat spreader 1 remains the same as in the primary embodiment, but a plurality of holes are formed on the pad 10 and on the frame of the heat spreader 1 for more reducing thermal stress of the package as well as for improving the operational reliability of the package. That is, the heat spreader 1 according to the second embodiment has four through holes or first holes 12, which holes 12 are formed between the first indentations 11 of the pad 10, so that the holes 12 are diagonally opposed to each other on the pad 10. In addition, a plurality of, for example, two, through holes or second holes 25 are formed between the second indentations 24, so that the second holes 25 are formed on the frame at the outside of the diagonally extending openings of the outward broadening opening 21. When molding the package having the above heat spreader 1 of the second embodiment, the mold compound passes through and is charged in the holes 12 and 25, thus to rigidly bond the heat spreader 1 to the leadframe. Therefore, the heat spreader of the second embodiment more reduces thermal stress, which stress will be applied to the package during the packaging as well as after packaging, and improves the operational reliability of the resulting package.

In order to experimentally estimate the characteristics of the heat spreader of the invention, 208 lead (208 LDS) MQFP packages having different heat spreaders were produced and subjected to reasonableness test, operational reliability test and impact test (test for down-bond reliability, for up-bond reliability and for delamination). The heat spreaders of Examples 1 to 4 and of Comparative Example 1 used in the tested packages are shown in Table 1.

TABLE 1

| Heat Spreaders used in the Tested Packages | | | |
|---|---|---|---|
| | Pad Size | Holes of Pad | Number |
| Ex. 1 | 9.30 × 14.36 | None | 5 |
| Ex. 2 | 9.30 × 14.36 | 4 | 5 |
| Ex. 3 | 15.65 × 16.12 | None | 5 |
| Ex. 4 | 15.65 × 16.12 | 4 | 5 |
| Com. Ex. 1 | 9.30 × 14.36 | G4C custom HS | 5 |

1) Thermal Characteristics:

Each of the heat spreaders according to Examples 1 to 4 of the invention exhibited good thermal performance which was improved by about 1° C./W than the heat spreader according to Comparative Example 1. This is considered as the result of the prevention of delamination of the semiconductor packages. The packages having the heat spreaders of Examples 1 to 4 could be practically used under the condition of no air flow and up to 2.4 Watt. The results of test for thermal characteristics are given in Tables to follow.

2) Operational Reliability of Packages:

After packaging with the heat spreaders of Examples 1 to 4 and of Comparative Example 1, the packages were subjected to operational reliability/stress test. Thereafter, the mold compound is removed from each package, and the bared heat spreaders were subjected to a wire pull strength test as well as to a ball shear strength test. As a result of the wire pull strength test and of the ball shear strength test, it was noted that all the heat spreaders agree with the standard limit.

Test Course a) standard preconditioning - - - baking: 24 hours at 125° C., 5 times T/C (temperature cycle) (Example 3), 85° C./30% RH of T/H (temperature/humidity) cycle for 168 hours, 3 times VPS (vapor phase soldering) (Example 3).

b) SAT (static atmospheric temperature), DCWP (decapsulation and wire pull) and DCBS (decapsulation and ball shear test).

c) T/C: 500 times (Example 2).

d) SAT, DCWP and DCBS e) T/C: 1000 times (Example 2)

f) SAT, DCWP and DCBS: 5 unit/eg

TABLE 2

DCWP/BALL SHEAR -- E.O.L (End of Line in Assembly) TEST

| Examples | Shear Strength | Wire Pull | | | | Ball Shear | | | |
|---|---|---|---|---|---|---|---|---|---|
| | | Min. | Max. | S.D | Aver. | Min. | Max. | S.D | Aver. |
| Ex. 1 (U.B) | 15 | 7.7 | 13.6 | 1.69 | 10.6 | 75.7 | 85.7 | 3.17 | 80.4 |
| Ex. 1 (D.B) | 15 | 8.6 | 17.1 | 2.45 | 14.1 | 77.5 | 89.1 | 3.61 | 82.4 |
| Ex. 2 (U.B) | 15 | 8.4 | 13.5 | 1.23 | 10.9 | 75.7 | 89.8 | 3.07 | 84.8 |
| Ex. 2 (D.B) | 15 | 12.0 | 15.9 | 1.02 | 13.5 | 77.6 | 85.5 | 2.07 | 81.6 |
| Ex. 3 (U.B) | 15 | 10.3 | 13.6 | 1.02 | 12.0 | 67.5 | 74.4 | 1.89 | 71.5 |
| Ex. 3 (D.B) | 15 | 10.6 | 16.4 | 1.45 | 14.1 | 70.8 | 79.2 | 2.08 | 73.9 |
| Ex. 4 (U.B) | 15 | 10.1 | 13.7 | 1.21 | 12.1 | 74.3 | 84.2 | 2.74 | 78.2 |
| Ex. 4 (D.B) | 15 | 11.7 | 17.9 | 1.93 | 15.3 | 68.1 | 83.9 | 4.27 | 75.0 |
| C. 1 (U.B) | 15 | 9.8 | 13.1 | 1.15 | 11.8 | 55.3 | 90.5 | 8.11 | 83.1 |
| C. 1 (D.B) | 15 | 11.4 | 19.0 | 2.26 | 15.2 | 77.4 | 92.2 | 4.22 | 83.6 |

S.D: standard deviation
Aver.: average
U.B: UP BOND: bonding of chip to inner leads of leadframe
D.B: OWN BOND: contact bonding of chip to leadframe
C.: Comparative Example

TABLE 3

Cpk for WIRE PULL

| | Cpk | | | | |
|---|---|---|---|---|---|
| | Ex. 1 | Ex. 2 | Ex. 3 | Ex. 4 | Com. ex 1 |
| UP BOND | 1.10 | 1.62 | 2.30 | 1.95 | 1.96 |
| DOWN BOND | 1.24 | 2.76 | 2.09 | 1.78 | 1.51 |

TABLE 4

Cpk for BALL SHEAR

| | Cpk | | | | |
|---|---|---|---|---|---|
| | Ex. 1 | Ex. 2 | Ex. 3 | Ex. 4 | Com. ex 1 |
| UP BOND | 4.24 | 4.86 | 5.56 | 4.64 | 1.77 |
| DOWN BOND | 3.92 | 6.71 | 5.43 | 2.73 | 3.44 |

TABLE 5

DCWP/BALL SHEAR (after Preconditioning)

| Examples | Shear Strength | Wire Pull | | | | Ball Shear | | | |
|---|---|---|---|---|---|---|---|---|---|
| | | Min. | Max. | S.D | Aver. | Min. | Max. | S.D | Aver. |
| Ex. 1 (U.B) | 15 | 9.7 | 12.6 | 0.91 | 11.4 | 70.9 | 84.6 | 3.54 | 79.7 |
| Ex. 1 (D.B) | 15 | 12.3 | 18.9 | 2.09 | 14.7 | 78.3 | 87.1 | 2.45 | 81.4 |
| Ex. 2 (U.B) | 15 | 11.8 | 14.5 | 0.63 | 13.4 | 77.3 | 83.4 | 1.75 | 79.7 |
| Ex. 2 (D.B) | 15 | 11.8 | 17.8 | 1.54 | 15.9 | — | 79.7 | 2.67 | 75.7 |
| Ex. 3 (U.B) | 15 | 11.0 | 14.1 | 0.83 | 12.6 | 67.6 | 78.1 | 3.71 | 73.4 |
| Ex. 3 (D.B) | 15 | 12.4 | 16.5 | 1.25 | 14.0 | 66.4 | 75.3 | 2.37 | 70.21 |
| Ex. 4 (U.B) | 15 | 8.61 | 12.9 | 1.34 | 11.0 | 64.1 | 73.9 | 2.75 | 68.8 |
| Ex. 4 (D.B) | 15 | 10.6 | 17.6 | 2.21 | 14.1 | 64.6 | 75.5 | 3.76 | 69.7 |
| C. 1 (U.B) | 15 | 7.6 | 12.5 | 1.13 | 11.3 | 75.2 | 83.1 | 2.99 | 79.3 |
| C. 1 (D.B) | 15 | 11.2 | 15.7 | 1.09 | 12.9 | 75.6 | 87.1 | 3.50 | 80.6 |

U.B = UP BOND
D.B = DOWN BOND
base: at least 5 grf in wire pull at least 40 grf in ball shear

TABLE 6

DCWP/DCBS (after 500 times of T/C)

| Examples | Shear Strength | Wire Pull | | | | Ball Shear | | | |
|---|---|---|---|---|---|---|---|---|---|
| | | Min. | Max. | S.D | Aver. | Min. | Max. | S.D | Aver. |
| Ex. 1 (U.B) | 15 | 6.5 | 12.2 | 1.93 | 9.6 | 91.3 | 107.1 | 5.13 | 100.1 |
| Ex. 1 (D.B) | 15 | 8.3 | 13.1 | 1.60 | 10.4 | 91.9 | 111.0 | 6.78 | 99.9 |

TABLE 6-continued

DCWP/DCBS (after 500 times of T/C)

| Examples | Shear Strength | Wire Pull | | | | Ball Shear | | | |
| --- | --- | --- | --- | --- | --- | --- | --- | --- | --- |
| | | Min. | Max. | S.D | Aver. | Min. | Max. | S.D | Aver. |
| Ex. 2 (U.B) | 15 | 7.6 | 11.8 | 1.50 | 10.1 | 88.3 | 93.6 | 2.51 | 98.4 |
| Ex. 2 (D.B) | 15 | 6.7 | 11.9 | 1.40 | 9.4 | 87.5 | 99.7 | 3.56 | 92.3 |
| Ex. 3 (U.B) | 15 | 10.6 | 13.6 | 0.82 | 12.1 | 77.2 | 92.0 | 3.87 | 86.6 |
| Ex. 3 (D.B) | 15 | 9.9 | 15.8 | 1.52 | 12.4 | 79.5 | 98.4 | 3.63 | 85.9 |
| Ex. 4 (U.B) | 15 | 10.8 | 12.4 | 0.47 | 11.7 | 77.9 | 88.5 | 2.98 | 81.2 |
| Ex. 4 (D.B) | 15 | 11.9 | 15.4 | 1.10 | 13.9 | 77.6 | 89.9 | 2.65 | 81.7 |
| C. 1 (U.B) | 15 | 7.6 | 12.6 | 1.51 | 10.91 | 76.4 | 106.0 | 6.74 | 96.5 |
| C. 1 (D.B) | 15 | 8.0 | 14.2 | 1.79 | 11.3 | 85.5 | 104.5 | 3.98 | 95.7 |

U.B = UP BOND
D.B = DOWN BOND
base: at least 5 grf in wire pull at least 40 grf in ball shear

TABLE 7

DCWP/DCBS (after 1000 times T/C)

| Examples | Shear Strength | Wire Pull | | | | Ball Shear | | | |
| --- | --- | --- | --- | --- | --- | --- | --- | --- | --- |
| | | Min. | Max. | S.D | Aver. | Min. | Max. | S.D | Aver. |
| Ex. 1 (U.B) | 15 | 9.6 | 11.3 | 1.53 | 10.5 | 75.1 | 84.7 | 2.59 | 78.9 |
| Ex. 1 (D.B) | 15 | 8.7 | 15.9 | 1.80 | 11.9 | 74.2 | 85.2 | 3.04 | 80.2 |
| Ex. 2 (U.B) | 15 | 9.7 | 11.4 | 0.47 | 10.5 | 70.8 | 81.8 | 3.12 | 77.2 |
| Ex. 2 (D.B) | 15 | 11.1 | 16.7 | 1.79 | 14.2 | 67.7 | 91.5 | 3.56 | 74.6 |
| Ex. 3 (U.B) | 15 | 10.6 | 13.4 | 0.70 | 11.8 | 67.9 | 77.0 | 2.69 | 72.7 |
| Ex. 3 (D.B) | 15 | 11.3 | 15.9 | 1.39 | 13.3 | 66.1 | 74.0 | 2.59 | 70.1 |
| Ex. 4 (U.B) | 15 | 11.4 | 15.3 | 0.94 | 12.2 | 55.6 | 70.7 | 3.72 | 66.3 |
| Ex. 4 (D.B) | 15 | 11.6 | 15.5 | 1.25 | 14.1 | 61.7 | 76.0 | 4.07 | 67.4 |
| C. 1 (U.B) | 15 | 9.7 | 11.0 | 0.38 | 10.51 | 72.6 | 78.1 | 1.50 | 74.6 |
| C. 1 (D.B) | 15 | 11.0 | 16.7 | 2.08 | 13.8 | 70.2 | 81.3 | 3.06 | 75.7 |

U.B = UP BOND
D.B = DOWN BOND
base: at least 5 grf in wire pull at least 40 grf in ball shear From the above data of test results, it is noted that the wire pull strength of each down bond is lower than that of each up bond due to difference of length between each down bond and each up bond. Furthermore, when the pad size is larger, the average ball shear strength is lower. When checking the average ball shear strength of the up bond, a heat spreader having the first holes 12 exhibits better strength than both heat spreader having no first hole and heat spreader of Comparative Example 1 when the pad sizes are equal to each other.

That is, the present invention provides an improved heat spreader which is suitable for commonly used in semiconductor packages regardless of pad sizes of the packages and reduces thermal stress, which stress will be applied to the package during the packaging as well as after packaging, and improves the operational reliability of the resulting package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A heat spreader for a semiconductor package comprising:

a center pad having a center surface on a side of the spreader adapted to face a leadframe, said center surface having a plurality of first indentations;

a plurality of generally rectangular, through openings broadening radially outwardly of said pad;

a plurality of second indentations provided on said side of the heat spreader and at a position radially outward of the openings, such that said second indentations surround said openings;

a plurality of small coupling sections radially extending on a peripheral edge of the heat spreader at every 90° angle, said small coupling sections including downward extending distal projections; and a plurality of large coupling sections diagonally extending from the peripheral edge of the heat spreader, such that the large coupling sections and the small coupling sections are alternately placed on the peripheral edge of the heat spreader, each of said large coupling sections having a plurality of outward extending projections.

2. The heat spreader according to claim 1, wherein said pad further includes four through holes, said through holes being provided between said first indentations of the pad, such that the through holes are diagonally opposed to each other on the pad.

3. The heat spreader according to claim 1, further comprising a plurality of through holes provided between ones of said second indentations at a position outside of said outwardly broadening openings and adjacent to said diagonally extending large coupling sections.

4. The heat spreader according to claim 1, further comprising peripheral dimples extending into said heat spreader on the peripheral edges of the heat spreader between said large coupling sections and small coupling sections.

5. The heat spreader according to claim 1, wherein an asteroid-shaped series of frames integrally extend from said pad between said openings; and wherein said pad is in a plane displaced from a plane of said series of legs.

* * * * *